United States Patent
Guo et al.

(10) Patent No.: US 10,453,540 B2
(45) Date of Patent: Oct. 22, 2019

(54) METHOD AND APPARATUS TO PRIORITIZE READ RESPONSE TIME IN A POWER-LIMITED STORAGE DEVICE

(71) Applicant: Intel Corporation, Santa Clara, CA (US)

(72) Inventors: Xin Guo, San Jose, CA (US); Yu Du, Hangzhou (CN); Curtis Gittens, Vancouver (CA); David J. Pelster, Longmont, CO (US); Donia Sebastian, Fair Oaks, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/959,538

(22) Filed: Apr. 23, 2018

(65) Prior Publication Data

US 2019/0043593 A1    Feb. 7, 2019

(51) Int. Cl.
*G11C 16/30* (2006.01)
*G11C 16/26* (2006.01)
*G11C 16/32* (2006.01)
*G06F 3/06* (2006.01)
*G06F 13/18* (2006.01)

(52) U.S. Cl.
CPC ............. *G11C 16/30* (2013.01); *G06F 3/06* (2013.01); *G06F 13/18* (2013.01); *G11C 16/32* (2013.01); *G11C 16/26* (2013.01)

(58) Field of Classification Search
CPC ......... G11C 16/30; G11C 16/32; G11C 16/26; G06F 3/06; G06F 13/18
See application file for complete search history.

(56) References Cited

U.S. PATENT DOCUMENTS

| | | | | |
|---|---|---|---|---|
| 9,727,267 | B1* | 8/2017 | Sebastian | G06F 3/0625 |
| 2016/0191420 | A1* | 6/2016 | Nagarajan | H04L 45/7453 370/389 |
| 2017/0300263 | A1* | 10/2017 | Helmick | G06F 3/0625 |
| 2018/0101323 | A1* | 4/2018 | Sebastian | G06F 3/061 |
| 2018/0260152 | A1* | 9/2018 | Bar | G06F 3/0625 |

\* cited by examiner

*Primary Examiner* — Tri M Hoang
(74) *Attorney, Agent, or Firm* — Compass IP Law, PC

(57) ABSTRACT

A reduction in Quality of Service (QoS) latency for host read commands in a power limited operation mode in a storage device is provided. A priority level is assigned to a host command using weighted round robin arbitration. Power resources are allocated based on the priority levels assigned to host commands to minimize host read command latency in the power limited operation mode.

25 Claims, 5 Drawing Sheets

METHOD AND APPARATUS TO PRIORITIZE READ RESPONSE TIME IN A POWER-LIMITED STORAGE DEVICE

FIELD

This disclosure relates to storage devices and in particular to prioritizing read response time in a power-limited storage device.

BACKGROUND

Nonvolatile memory refers to memory whose state is determinate even if power is interrupted to the device. Storage devices that include non-volatile memory include a secure digital card, a multimedia card, a flash drive (for example, a Universal Serial Bus (USB) flash drive also known as a "USB thumb drive" or "USB memory stick" that includes non-volatile memory with an integrated USB interface), and a solid-state drive.

A solid-state drive (SSD) is a storage device that stores data in non-volatile memory. Typically, the solid-state drive includes a block-based memory such as NAND Flash and a controller to manage read/write requests received from a host for data stored in the NAND Flash.

SSD Performance relates to how the SSD functions when accessing, retrieving or saving data. SSD performance is typically based on metrics including a number of Input Output Operations per Second (IOPS), throughput (for example, Megabytes per second (MB/s)) and response time (or latency) (for example, milliseconds or microseconds). IOPS is the number of I/O operations in a unit of time. Throughput is the amount of data transferred to or from the SSD. Response Time (or Latency) (also referred to a Quality of Service (QoS)) is the time it takes for a host command sent to the storage device by a host to complete the requested operation (for example, a host read command, or a host write command).

BRIEF DESCRIPTION OF THE DRAWINGS

Features of embodiments of the claimed subject matter will become apparent as the following detailed description proceeds, and upon reference to the drawings, in which like numerals depict like parts, and in which:

Although the following Detailed Description will proceed with reference being made to illustrative embodiments of the claimed subject matter, many alternatives, modifications, and variations thereof will be apparent to those skilled in the art. Accordingly, it is intended that the claimed subject matter be viewed broadly and be defined only as set forth in the accompanying claims.

DESCRIPTION OF EMBODIMENTS

Response Time (or Latency) for host read commands may be reduced using read prioritization algorithms in the solid-state drive (SSD). However, these read prioritization algorithms do not address latency bottlenecks that arise in power limited operation mode where the performance of the SSD is limited by power. In an embodiment, Quality of Service (QoS) latency for host read commands in a SSD is reduced when the SSD operates within the power limit for the SSD, that is, the SSD operates in power limited operation mode.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Figure 1:
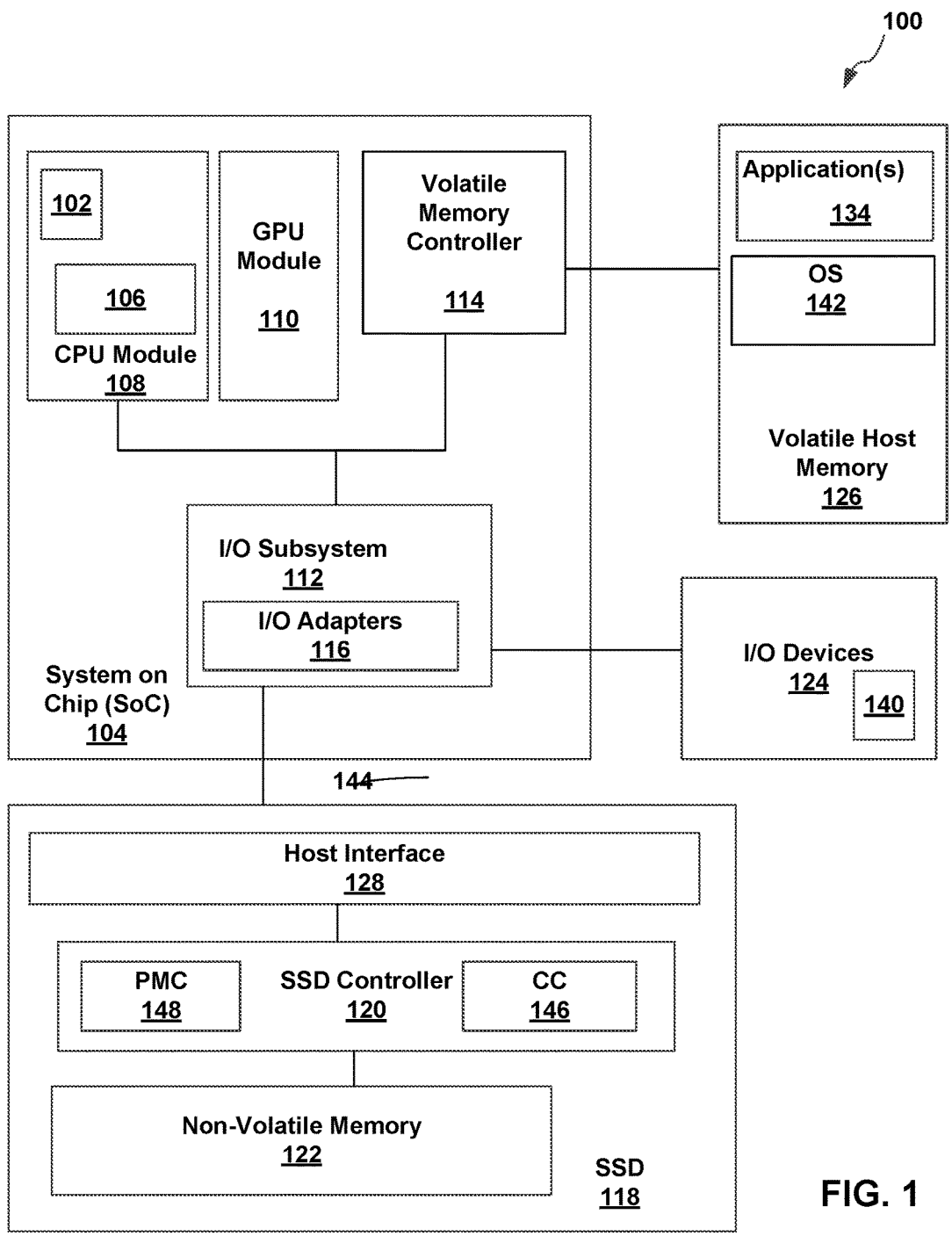
FIG. 1 is a block diagram of an embodiment a computer system that includes a solid-state drive (SSD) in power limited operation mode that includes logic to reduce Quality of Service (QoS) latency for host read commands.

FIG. 1 is a block diagram of an embodiment a computer system 100 that includes a solid-state drive that includes logic to reduce QoS latency for host read commands in power limited operation mode. Computer system 100 may correspond to a computing device including, but not limited to, a server, a workstation computer, a desktop computer, a laptop computer, and/or a tablet computer.

The computer system 100 includes a system on chip (SOC or SoC) 104 which combines processor, graphics, memory, and Input/Output (I/O) control logic into one SoC package. The SoC 104 includes at least one Central Processing Unit (CPU) module 108, a volatile memory controller 114, and a Graphics Processor Unit (GPU) 110. In other embodiments, the volatile memory controller 114 may be external to the SoC 104. Although not shown, each of the processor core(s) 102 may internally include one or more instruction/data caches, execution units, prefetch buffers, instruction queues, branch address calculation units, instruction decoders, floating point units, retirement units, etc. The CPU module 108 may correspond to a single core or a multi-core general purpose processor, such as those provided by Intel® Corporation, according to one embodiment.

The Graphics Processor Unit (GPU) 110 may include one or more GPU cores and a GPU cache which may store graphics related data for the GPU core. The GPU core may internally include one or more execution units and one or more instruction and data caches. Additionally, the Graphics Processor Unit (GPU) 110 may contain other graphics logic units that are not shown in FIG. 1, such as one or more vertex processing units, rasterization units, media processing units, and codecs.

Within the I/O subsystem 112, one or more I/O adapter(s) 116 are present to translate a host communication protocol utilized within the processor core(s) 102 to a protocol compatible with particular I/O devices. Some of the protocols that adapters may be utilized for translation include Peripheral Component Interconnect (PCI)-Express (PCIe); Universal Serial Bus (USB); Serial Advanced Technology Attachment (SATA) and Institute of Electrical and Electronics Engineers (IEEE) 1594 "Firewire".

The I/O adapter(s) 116 may communicate with external I/O devices 124 which may include, for example, user interface device(s) including a display and/or a touch-screen display 140, printer, keypad, keyboard, communication logic, wired and/or wireless, storage device(s) including hard disk drives ("HDD"), solid-state drives ("SSD"), removable storage media, Digital Video Disk (DVD) drive, Compact Disk (CD) drive, Redundant Array of Independent Disks (RAID), tape drive or other storage device. The storage devices may be communicatively and/or physically coupled together through one or more buses using one or more of a variety of protocols including, but not limited to, SAS (Serial Attached SCSI (Small Computer System Interface)), PCIe (Peripheral Component Interconnect Express), NVMe (NVM Express) over PCIe (Peripheral Component Interconnect Express), and SATA (Serial ATA (Advanced Technology Attachment)).

Additionally, there may be one or more wireless protocol I/O adapters. Examples of wireless protocols, among others, are used in personal area networks, such as IEEE 802.15 and Bluetooth, 4.0; wireless local area networks, such as IEEE 802.11-based wireless protocols; and cellular protocols.

The I/O adapter(s) 116 may also communicate with a solid-state drive ("SSD") 118 which includes a SSD controller 120, a host interface 128 and non-volatile memory 122 that includes one or more non-volatile memory devices. The SSD controller 120 includes a channel controller 146 and a power management controller 148. Commands (for example, read, write ("program"), erase commands for the non-volatile memory 122) are queued and processed by the channel controller 146. The power management controller 148 manages power allocation within the SSD 118 so that the SSD 118 may operate within an allocated power limit.

A non-volatile memory (NVM) device is a memory whose state is determinate even if power is interrupted to the device. In one embodiment, the NVM device can comprise a block addressable memory device, such as NAND technologies, or more specifically, multi-threshold level NAND flash memory (for example, Single-Level Cell ("SLC"), Multi-Level Cell ("MLC"), Quad-Level Cell ("QLC"), Tri-Level Cell ("TLC"), or some other NAND). A NVM device can also include a byte-addressable write-in-place three dimensional crosspoint memory device, or other byte addressable write-in-place NVM devices (also referred to as persistent memory), such as single or multi-level Phase Change Memory (PCM) or phase change memory with a switch (PCMS), NVM devices that use chalcogenide phase change material (for example, chalcogenide glass), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

The I/O adapters 116 may include a Peripheral Component Interconnect Express (PCIe) adapter that is communicatively coupled using the NVMe (NVM Express) over PCIe (Peripheral Component Interconnect Express) protocol over bus 144 to a host interface 128 in the SSD 118. Non-Volatile Memory Express (NVMe) standards define a register level interface for host software to communicate with a non-volatile memory subsystem (for example, a Solid-state Drive (SSD)) over Peripheral Component Interconnect Express (PCIe), a high-speed serial computer expansion bus. The NVM Express standards are available at www.nvmexpress.org. The PCIe standards are available at www.pcisig.com.

Volatile memory is memory whose state (and therefore the data stored in it) is indeterminate if power is interrupted to the device. Dynamic volatile memory requires refreshing the data stored in the device to maintain state. One example of dynamic volatile memory includes DRAM (Dynamic Random Access Memory), or some variant such as Synchronous DRAM (SDRAM). A memory subsystem as described herein may be compatible with a number of memory technologies, such as DDR3 (Double Data Rate version 3, original release by JEDEC (Joint Electronic Device Engineering Council) on Jun. 27, 2007). DDR4 (DDR version 4, initial specification published in September 2012 by JEDEC), DDR4E (DDR version 4), LPDDR3 (Low Power DDR version 3, JESD209-3B, August 2013 by JEDEC), LPDDR4) LPDDR version 4, JESD209-4, originally published by JEDEC in August 2014), WIO2 (Wide Input/Output version 2, JESD229-2 originally published by JEDEC in August 2014, HBM (High Bandwidth Memory, JESD325, originally published by JEDEC in October 2013, DDR5 (DDR version 5, currently in discussion by JEDEC), LPDDR5 (currently in discussion by JEDEC), HBM2 (HBM version 2), currently in discussion by JEDEC, or others or combinations of memory technologies, and technologies based on derivatives or extensions of such specifications. The JEDEC standards are available at wwwjedec.org.

An operating system 142 is software that manages computer hardware and software including memory allocation and access to I/O devices. Examples of operating systems include Microsoft® Windows®, Linux®, iOS® and Android®.

Figure 2:
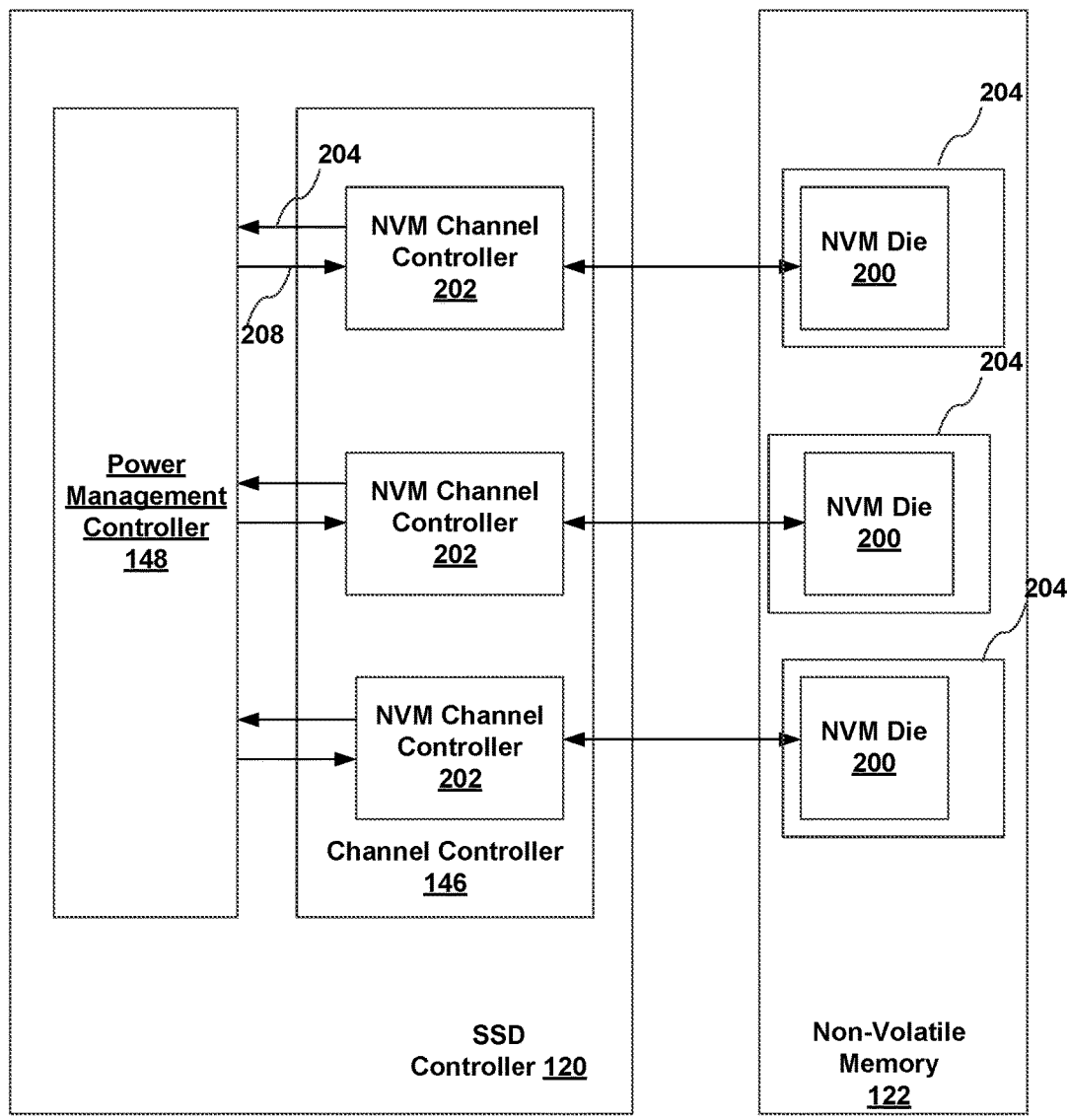
FIG. 2 is a block diagram of the SSD shown in FIG. 1.

FIG. 2 is a block diagram of the SSD 118 shown in FIG. 1. As discussed in conjunction with FIG. 1, the SSD 118 includes a SSD controller 120 and non-volatile memory 122. In an embodiment, the non-volatile memory 122 includes a plurality of non-volatile memory (NVM) dies 200 and the SSD is communicatively coupled over bus 144 to an I/O adapter 116 using the NVMe (NVM Express) over PCIe (Peripheral Component Interconnect Express) protocol. For example, the NVMe standard specifies that the operational power consumption of the SSD 118 cannot exceed 25 Watts (W) and thus in an embodiment in which the host interface 128 in SSD 118 uses the NVMe (NVM Express) over PCIe (Peripheral Component Interconnect Express) protocol, the SSD 118 is power limited. In an embodiment, the SSD 118 may be in a system that allows power delivery above the operational power consumption specified by the NVMe standard, and the SSD 118 may be configured for an operational power consumption that is below the maximum, for example, 5 W.

The SSD controller 120 includes the power management controller 148 and a channel controller 146. The channel controller 146 includes a NVM channel controller 202 per NVM channel 204. Each NVM channel 204 includes a plurality of NVM dies 200.

The power management controller 148 and the channel controller 146 provide a multi-stage priority-based servicing scheme to reduce QoS latency for host read commands in power limited operation mode. The power management controller 148 manages power allocation. For example, a host read command may use 100 milliwatts (mW) and a host write command may use 250 milliwatts (mW), and the power consumption of the SSD 118 may be limited to 25 Watts. The power management controller 148 manages the available power to ensure that the read latency required to meet QoS is met while also ensuring that the power consumption of the SSD 118 is within the power limit for the SSD 118.

A NVMe read command received by the host interface 128 in the SSD 118 includes a logical address. The SSD Controller 120 includes a logical-to-physical address mapping table. A task (also referred to as a command) issued to the NVM channel controller 202 includes the physical address for the read command corresponding to the logical address in the NVMe read command that is retrieved from the logical-to-physical mapping table. Each NVM channel controller 202 in the channel controller 146 queues and processes commands for NVM dies 200.

The SSD controller 120 may initiate a command to read data stored in NVM dies 200, write data ("write data" may also be referred to as "program") to NVM dies 200 and erase data stored in NVM dies 200. The SSD controller 120 assigns a priority level to each command that the SSD controller 120 initiates. Arbitration schemes and policies that may be implemented in arbiter logic within the channel controller 146 and the power management controller 148 ensure that channel/power resource allocations for each command are based on the assigned priority levels. The NVM channel controller 202 in the channel controller 146 processes the command and issues a request 206 to the power management controller 148 for power credits 208 to be allocated for the command prior to issuing the command to the NVM die(s) 200 in the NVM channel 204.

Figure 3:
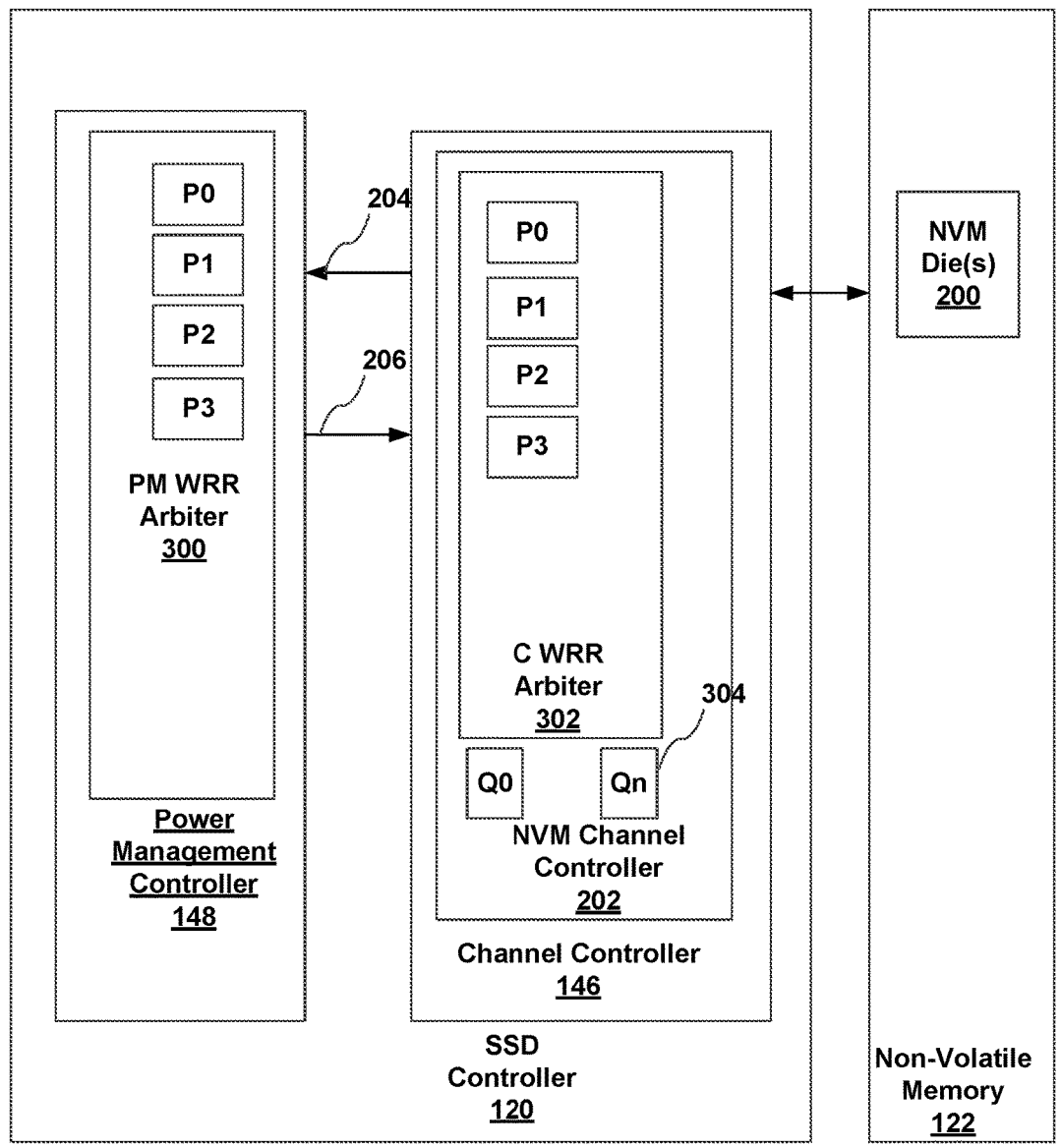
FIG. 3 is a block diagram of the power management controller and one of the non-volatile memory (NVM) channel controllers shown in FIG. 2.

FIG. 3 is a block diagram of the power management controller 148 and one of the NVM channel controllers 202 shown in FIG. 2. Each NVM channel controller 202 may manage multiple commands to be sent to different NVM dies 200. In an embodiment, the NVM die 200 is a block erasable NAND Flash die. The NVM Channel controller 202 manages a queue Q 304 per NVM die 200, all commands for the NVM die 200 are placed in the queue 304 associated with the NVM die 200. The power management controller 148 receives power allocation requests from each NVM channel controller 202. The NVM channel controller 202 waits until the power allocation request is granted by the power management controller 148 before processing a command (for example, a read, write, erase, host, background or any other command to the non-volatile memory).

QoS latency for host read commands is reduced in power limited operation mode by prioritizing host read commands over other host commands (for example, host program and host erase commands) and over any internal (initiated within the SSD 118) read commands initiated by the SSD controller 120 in the SSD 118. The host read commands are prioritized, in both the NVM Channel controller 202 and the power management controller 148 where host read commands may be stalled waiting for a resource (for example, power).

The SSD controller 120 assigns a priority level and swap control to each task issued to the channel controller 146 and the power management controller 148. The channel controller 146 and the power management controller 148 use the priority level and swap control assigned to the task to minimize host read queuing delay in a power limited operation mode of the SSD 118. The channel controller 146 and power management controller 148 include logic to select a task to perform within a NVM die queue 304 in a NVM channel controller 202, to select a task to perform across the plurality of NVM die queues (Q0 . . . Qn) 304 in a NVM channel controller 202, logic to select a NVM Channel controller 202 to grant a power request in the power management controller 148 and logic to adjust priority of a power allocation request between the NVM channel controller 202 and the power management controller 148.

The number of priority levels ("P") may be denoted as "N", with level 0 being the highest priority and level N−1 being the lowest priority. An embodiment with N=4 priority levels (P0-P3) will be described. However, the number of priority levels is not limited to 4, other embodiments may have more or less priority levels.

Each NVM channel controller 202 stores a task in a NVM die queue 304 in the order in which the task is to be processed by the NVM channel controller 202. When a new task is received, the NVM channel controller 202 reviews existing entries in the NVM die queue to determine the processing order for the new task and to adjust the priorities of existing tasks in the NVM die queue 304 as needed. The order in which the tasks are processed within a NVM die queue 304 is dependent on a "Priority" and a "Swap Enable" assigned to the task and on a "priority adjustment" assigned to the NVM channel controller 202 which will be described below in conjunction with FIG. 4 and FIG. 5.

A position in a NVM die queue 304 is selected for a task based on priority assigned to the task and the type of task. Each task includes an indication as to whether the processing order of the task in the queue can be modified ("task swap"), for example, the indication may be provided by a "swap enable" flag. A swap enable flag may be a bit included with the task that may be set to logical '1' or logical '0' to indicate whether processing order modification ("swap") in a queue is enabled or disabled for that task.

Policies on prioritizing a read command over another type of command (for example, a write/erase command) directed to the non-volatile memory dictates which tasks may have the "Swap Enable" flag set to enable modification of the processing order of tasks in the queue and these policies are defined such that starvation scenarios do not arise. A starvation scenario may occur if a write task is stalled while back-to-back read tasks with "Swap Enable" flag set are continually issued ahead of the write task. Swap enable is cleared if there is an address collision between a write task and a read task. For example, a write task to write data to a new physical address is received followed by a read task to read from the same physical address. The Swap Enable bit is cleared for the read task so that the read task is performed after completion of the write task.

Figure 4:
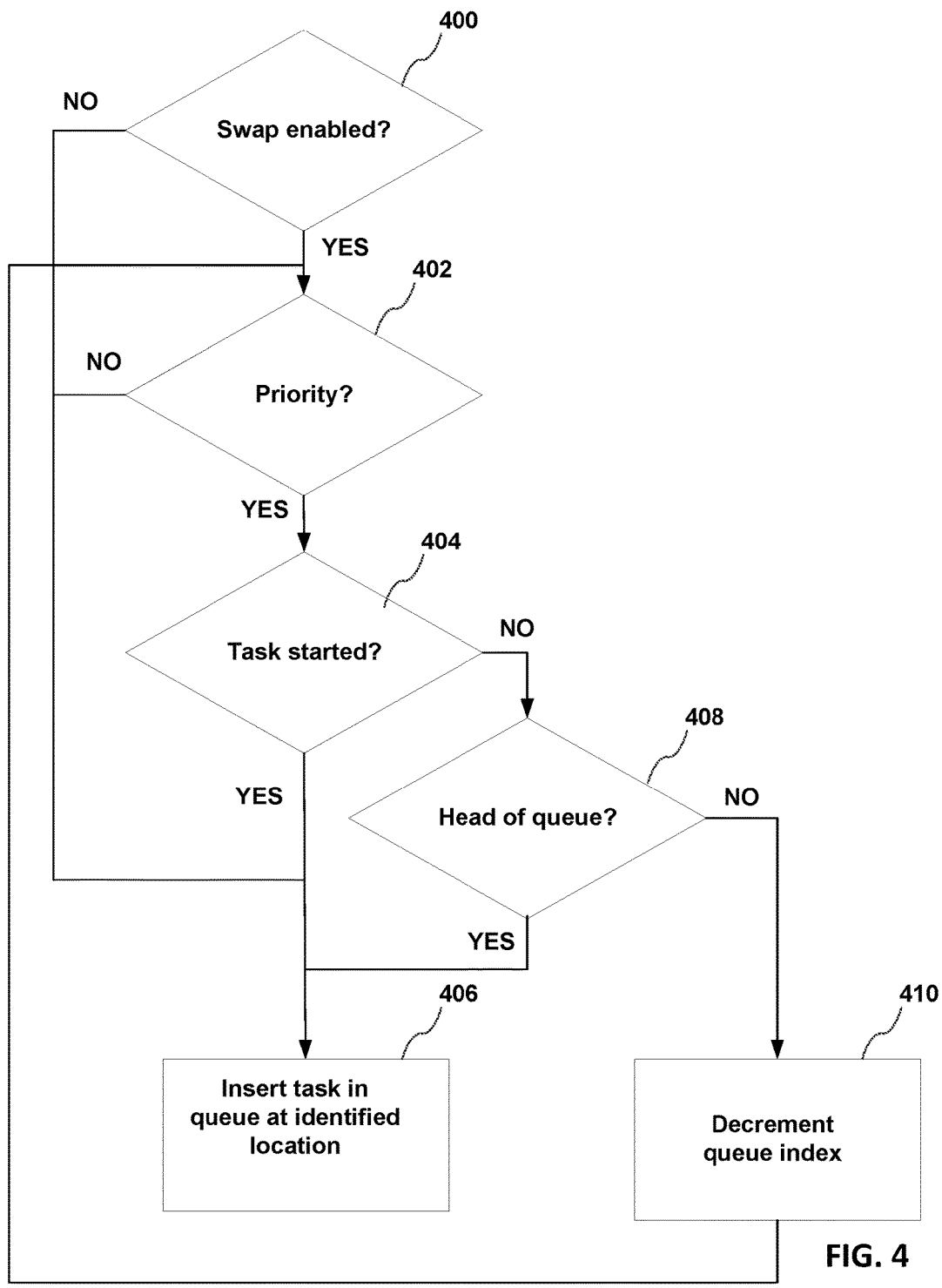
FIG. 4 is a flowgraph of a method performed by the NVM channel controller to determine a position in a NVM queue to insert a task.

FIG. 4 is a flowgraph of a method performed by the NVM channel controller 202 to determine a position in a NVM die queue 304 to insert a task.

At block 400, if the swap enable flag for the task is set, processing continues with block 402. If the swap enable flag for the task is not set, processing continues with block 406 to insert the task at the end of the NVM die queue 304.

At block 402, the "Swap Enable" flag is set, scanning of the NVM die queue 304 is performed starting from the task at the tail of the NVM die queue 304 and moving towards the head of the NVM die queue 304. If the priority of the task to be inserted in the NVM die queue 304 is higher than the priority of the task in the current entry in the NVM die queue 304, processing continues with block 404. For example, if the task is a host read command with priority level 0, task swap is enabled, and there is a task in the NVM die queue 304 with priority level 3 (lower priority), the host read command is inserted in the NVM die queue 304 in a position in the NVM die queue 304 ahead of the task with priority level 3 (towards the head of the queue).

If the task to be added to the NVM die queue 304 has a priority lower than or equal to the priority of the task in the current entry in the NVM die queue 304, the task is inserted in the entry below the current entry in the NVM die queue 304 (towards the tail of the queue), processing continues with block 406.

At block 404, if the new task to be inserted in the NVM die queue 304 has a priority higher than the task in the current entry in the NVM die queue 304 and the task in the current entry in the NVM die queue 304 has not yet started, processing continues with block 408 to determine the priority of the task above the current task in the NVM die queue 304. If the new task has a priority higher than the current task in the NVM die queue 304 and the task is being processed by the NVM channel controller 202, processing continues with block 406 to insert the new task in the NVM die queue 304 below the current task.

At block 406, the new task is inserted in the NVM die queue 304 at the selected entry.

At block 408, if the current entry is the head of the NVM die queue 304, processing continues with block 406 to insert the new task at the head of the NVM die queue 304.

At block 410, the queue index is decremented to access the next entry in the NVM die queue 304. Processing continues with block 402 to check the priority of the task in the next entry in the queue. The process to scan entries in the NVM die queue 304 to select an entry in which to insert the new task continues until an entry in the NVM die queue 304 is selected or the new task is inserted in the entry at the head of the NVM die queue 304.

Figure 5:
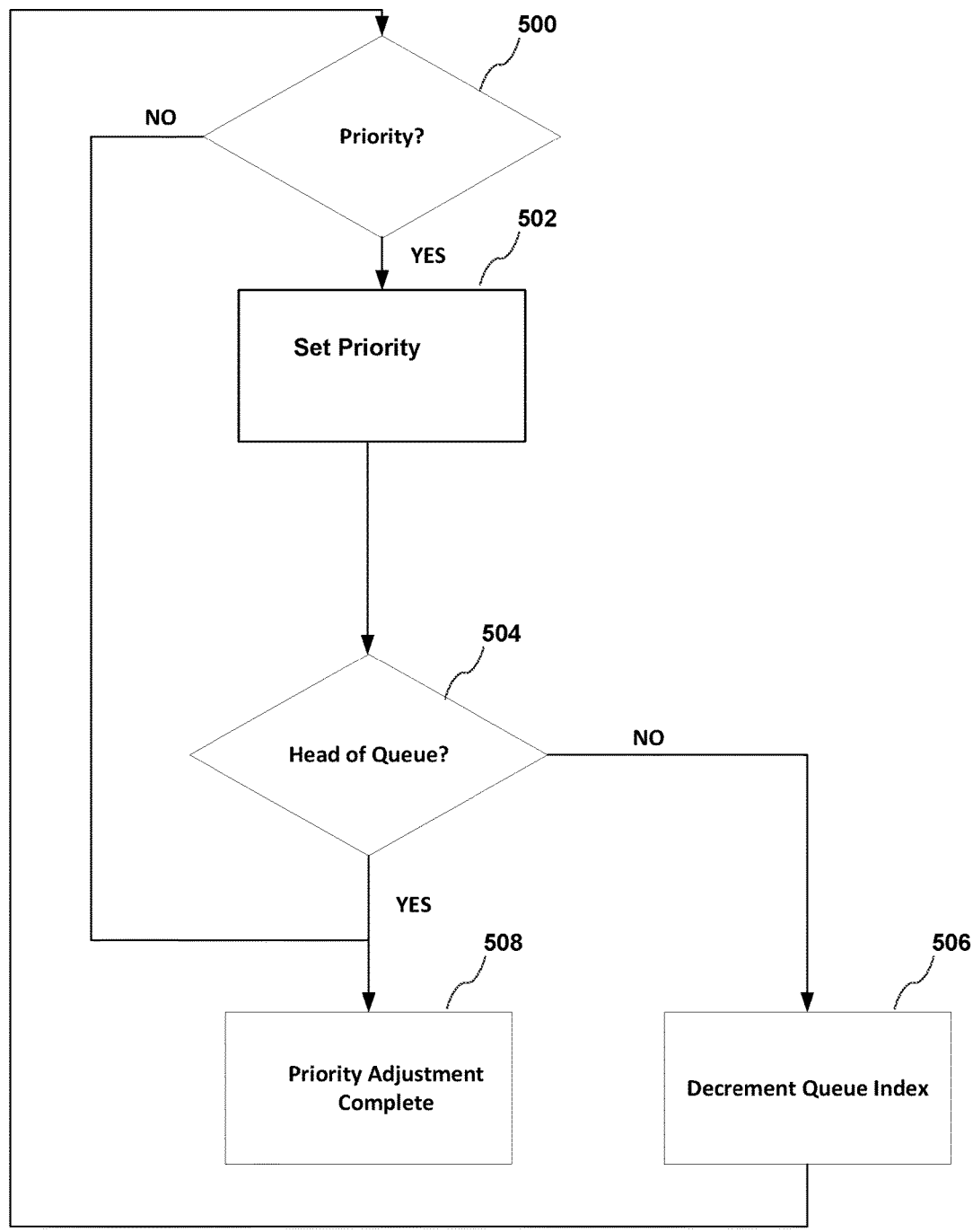
FIG. 5 is a flowgraph of a method performed by the NVM channel controller to modify the priority assigned to tasks in the NVM queue after a new task has been inserted in the NVM queue.

FIG. 5 is a flowgraph of a method performed by the NVM channel controller 202 to modify the priority assigned to tasks in the NVM die queue 304 after a new task has been inserted in the NVM die queue 304. After a new task has been inserted in the NVM die queue 304, the priority of tasks in the NVM die queue 304 ahead of the newly added task may be modified.

For example, if the new task inserted in the NVM die queue 304 is a host read command with level 0 priority (highest priority) and the host read command has an address collision with another type of command (for example, a host write command or erase command) that is also in the queue with level 3 priority, task re-ordering is prevented by disabling swap enable via the "Swap Enable" flag included with the host read command. With swap disabled, the host read command is inserted in the tail (last entry) of the NVM die queue 304. If priority adjustment is enabled, the NVM channel controller 202 modifies the priority of the host write command from level 3 priority to level 0 priority (highest priority) to correspond to the priority of host read command at the tail of the NVM die queue 304.

The auto priority adjustment may be enabled/disabled per NVM channel 204 and is performed after the task swap has completed and the new task has been inserted in the NVM die queue 304. The auto priority adjustment starts with the task in the NVM die queue 304 above the new task and continues with tasks in the NVM die queue 304 in the direction of the head of the NVM die queue 304.

At block 500, the priority assigned to the newly added task and the priority assigned to the current task are compared. If the priority assigned to the newly added task is lower than or equal to the priority assigned to the current task in the NVM die queue 304, processing continues with block 508. If the priority assigned to the newly added task is higher than the priority assigned to the current task in the NVM die queue 304, processing continues with block 502.

At block 502, the priority assigned to the newly added task is higher than the priority assigned to the current task in the NVM die queue 304, the priority of the current task is set to the same priority level of the new task. Processing continues with block 504.

At block 504, if the current task is the task at the head of the queue, processing continues with block 508. If not, processing continues to block 506.

At block 506, the queue index is decremented to access the next entry in the NVM die queue 304. Processing continues with block 500.

At block 508, processing of the priority adjustment to tasks in the queue is complete.

Returning to FIG. 3, when a NVM Channel controller 202 is ready to service a new task, a request is sent to a channel Weighted Round Robin (WRR) arbiter 302 to obtain the priority level of the next task to be processed. The NVM die queues 304 that have a task pending to be executed at the head of the NVM die queue 304, submit the respective head-of-queue task into one of the N priority levels ($P_0$-$P_{N-1}$) in the channel WRR arbiter logic 302 based on the priority assigned to the task. The values to be used as weight for each of the N priority levels in the channel WRR arbiter logic 302 may be configured by each NVM channel controller 202. In an embodiment, Priority level $P_0$ is the highest priority and priority level $P_{N-1}$ is the lowest priority.

The weighted round robin arbiter logic 302 allows tasks to share the bandwidth of the NVM die relative to the priority level assigned to the tasks. WRR queuing permits the allocation of different amounts of memory bandwidth to different priority levels by allowing higher priority queues to send more than one task to the NVM die 200 when the queue is enabled.

Each priority level (P0-P3) includes a grant counter and a target count. The target count is the weight assigned to the priority level. For example, priority levels P0-P3 may be assigned weights as follows P0: 512; P1: 256; P2: 128; P3: 1. The channel WRR arbiter logic 302 ensures that for every 512 tasks executed from P0 level, there are 256 tasks executed from P1 level, 128 from P2 level and 1 from P3 level, so that the ratio is maintained in terms of the number of tasks executed across the priority levels.

The grant counter tracks the number of tasks performed for the priority level since the grant counter was last reset. If there are pending requests in multiple priority levels, the task that wins arbitration is the first queued task in the highest priority level that has pending requests if the grant count stored in the grant counter for the priority level is less than the target count for the priority level. The grant counter for the priority level that wins arbitration is incremented. The grant counters for all priority levels are reset when the grant count in the grant counter equals the target count for all priority levels or when there are no pending requests in all of the priority levels.

After a priority level wins arbitration, the NVM channel controller 202 uses a channel round-robin scheduler across the NVM die queues 304 with pending requests at that priority level to select the task in the respective NVM die queue 304. The round robin scheduler selects a NVM die queue 304 at the selected priority level for power credit request. Prior to dispatching a task (read, program (write), erase) in a queue to the NVM die queue 304, the NVM channel controller 202 sends a request that includes the priority level of the task to the power management controller 148 to obtain a power credit.

The power management controller 148 includes a weighted round-robin (WRR) arbiter 300 across all the priority levels, to determine when the requested power credit can be granted. Power credit requests from NVM channel controllers 202 are queued in the power management controller 148 based on the priority level specified in a request for power credit. The power management controller 148 supports arbitration across a maximum of N priority levels ($P_0$-$P_{N-1}$). For each of the N priority levels, a weight value may be stored to be used as the weight in WRR arbitration. In an embodiment, priority level 0 ($P_0$) is the highest priority and priority level $P_{N-1}$ is the lowest priority.

Each priority level includes a power management grant counter and a power management target count. The power management target count is the weight assigned to the priority level. The power management grant counter tracks the number of time slots granted to the priority level since the power management grant counter was last reset. If there are pending requests in multiple priority levels, the first queued task in the highest priority level that has pending requests with a power management grant counter value that is less than the power management target value wins arbitration and the power management grant counter for the priority level is incremented. The power management grant counters for all priority levels are reset when the grant count in the power management grant counter equals the power management target count for all priority levels or when there are no pending power credit requests in all of the priority levels.

The priority of the power credit request made by a NVM Channel controller 202 for a selected task corresponds to that of the highest priority level in the NVM Channel controller WRR 302 that has a task pending. If a NVM Channel controller 202 is stalled waiting for the power management controller 148 to grant power credits for a request, and there are new tasks submitted for higher priority levels in the Channel WRR Arbiter 302 by other queues, the priority of the stalled power credit request is increased to the priority of the highest priority level in the NVM Channel controller WRR Arbiter 302 that has a request pending.

The interface between the channel controller 146 and the power management controller 146 allows the priority level of the request to be changed while the request is pending. Any change in the priority level of the power credit allocate request while it is stalled causes the power credit request to be serviced at the new priority level in the weighted round robin arbiter 300 in the power management controller 148.

Flow diagrams as illustrated herein provide examples of sequences of various process actions. The flow diagrams can indicate operations to be executed by a software or firmware routine, as well as physical operations. In one embodiment, a flow diagram can illustrate the state of a finite state machine (FSM), which can be implemented in hardware and/or software. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A solid-state drive comprising:
   a non-volatile memory channel controller communicatively coupled to a non-volatile memory; and
   a power management controller communicatively coupled to the non-volatile memory channel controller, the power management controller comprising:
   logic to perform weighted round robin arbitration to prioritize a request from the non-volatile memory channel controller for a power credit for a host read command directed to the non-volatile memory to minimize the host read command latency in a power limited operation mode.

2. The solid-state drive of claim 1, wherein the logic to perform weighted round robin arbitration to prevent starvation of another type of command directed to the non-volatile memory.

3. The solid-state drive of claim 1, wherein, the non-volatile memory includes a plurality of non-volatile memory dies and the non-volatile memory channel controller includes a command queue per non-volatile memory die, the non-volatile memory channel controller to swap order and to adjust priority of the host read command in the command queue to prioritize the host read command.

4. The solid-state drive of claim 3, wherein the non-volatile memory channel controller further comprises:
   arbiter logic to perform weighted round robin arbitration to select the request to send to the power management controller for the power credit.

5. The solid-state drive of claim 4, wherein the non-volatile memory channel controller to increase priority level of the request for the power credit while the request is pending.

6. The solid-state drive of claim 3, wherein a priority level assigned to the host read command is higher than another priority level assigned to a host write command.

7. The solid-state drive of claim 1, wherein the non-volatile memory is NAND Flash.

8. A method comprising:
issuing a request, by a non-volatile memory channel controller for a power credit for a host read command directed to a non-volatile memory; and
performing weighted round robin arbitration, by a power management controller to prioritize the request from the non-volatile memory channel controller for the power credit to minimize the host read command latency in a power limited operation mode of a solid-state drive.

9. The method of claim 8, wherein performing weighted round robin arbitration to prevent starvation of another type of command directed to the non-volatile memory.

10. The method of claim 9, further comprising:
swapping order of the host read command in a command queue per non-volatile memory die in the non-volatile memory; and
adjusting priority of the host read command in a command queue per non-volatile memory die in the non-volatile memory to prioritize the host read command.

11. The method of claim 10, further comprising:
performing weighted round robin arbitration to select the request to send to the power management controller for the power credit.

12. The method of claim 11, further comprising:
increasing, by the non-volatile memory channel controller, the priority of the request for the power credit while the request is pending.

13. The method of claim 9, wherein a priority level assigned to the host read command is higher than another priority level assigned to a host write command.

14. The method of claim 9, wherein the non-volatile memory is NAND Flash.

15. A system comprising:
a non-volatile memory channel controller communicatively coupled to a non-volatile memory;
a power management controller communicatively coupled to the non-volatile memory channel controller, the power management controller comprising:
logic to perform weighted round robin arbitration to prioritize a request from the non-volatile memory channel controller for a power credit for a host read command directed to the non-volatile memory to minimize the host read command latency in a power limited operation mode; and
a display communicatively coupled to a processor to display data stored in the non-volatile memory.

16. The system of claim 15, wherein, the non-volatile memory includes a plurality of non-volatile memory dies and the non-volatile memory channel controller includes a command queue per non-volatile memory die, the non-volatile memory channel controller to swap order and to adjust priority of the host read command in the command queue to prioritize the host read command.

17. The system of claim 16, wherein the non-volatile memory channel controller further comprises:
arbiter logic to perform weighted round robin arbitration to select the request to send to the power management controller for the power credit.

18. The system of claim 17, wherein the non-volatile memory channel controller to increase priority level of the request for the power credit while the request is pending.

19. The system of claim 15, wherein a priority level assigned to the host read command is higher than another priority level assigned to a host write command.

20. The system of claim 15, wherein the non-volatile memory is NAND Flash.

21. At least one non-transitory computer-readable storage medium storing instructions that, when executed by a processor cause a system to:
issue a request, by a non-volatile memory channel controller for a power credit for a host read command directed to a non-volatile memory; and
perform weighted round robin arbitration, by a power management controller to prioritize the request from the non-volatile memory channel controller for the power credit for the host read command to minimize the host read command latency in a power limited operation mode of a solid-state drive and to prevent starvation of another type of command directed to the non-volatile memory.

22. The non-transitory computer-readable storage medium of claim 21, further comprising:
swap order of the host read command in a command queue per non-volatile memory die in the non-volatile memory; and
adjust priority of the host read command in a command queue per non-volatile memory die in the non-volatile memory to prioritize the host read command.

23. The non-transitory computer-readable storage medium of claim 22, further comprising:
perform weighted round robin arbitration, non-volatile memory channel controller, to select the request to send to the power management controller for the power credit.

24. The non-transitory computer-readable storage medium of claim 23, further comprising:
increase a priority level of the request for the power credit while the request is pending.

25. The non-transitory computer-readable storage medium of claim 21, wherein the non-volatile memory is NAND Flash.

* * * * *